(12) United States Patent
Cheng et al.

(10) Patent No.: US 10,600,731 B2
(45) Date of Patent: Mar. 24, 2020

(54) FOLDED METAL-OXIDE-METAL CAPACITOR OVERLAPPED BY ON-CHIP INDUCTOR/TRANSFORMER

(71) Applicant: QUALCOMM Incorporated, San Diego, CA (US)

(72) Inventors: Haitao Cheng, San Diego, CA (US); Zhang Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/006,657

(22) Filed: Jun. 12, 2018

(65) Prior Publication Data
US 2019/0259701 A1   Aug. 22, 2019

Related U.S. Application Data

(60) Provisional application No. 62/632,692, filed on Feb. 20, 2018.

(51) Int. Cl.
*H01L 27/08* (2006.01)
*H01L 23/522* (2006.01)
(Continued)

(52) U.S. Cl.
CPC ........ *H01L 23/5223* (2013.01); *H01L 23/528* (2013.01); *H01L 23/5227* (2013.01);
(Continued)

(58) Field of Classification Search
CPC . H01L 23/5223; H01L 23/5227; H01L 28/40; H01L 28/10; H01L 23/528; H03H 1/0007; H03H 2001/0021
See application file for complete search history.

(56) References Cited

U.S. PATENT DOCUMENTS 6,072,205 A   6/2000  Yamaguchi et al.
6,297,524 B1 * 10/2001 Vathulya ............. H01L 23/5223
                                                      257/296
(Continued)

FOREIGN PATENT DOCUMENTS

JP    H06333740 A    12/1994
JP    2012199424 A   10/2012
(Continued)

OTHER PUBLICATIONS

International Search Report and Written Opinion—PCT/US2019/013702—ISA/EPO—dated Apr. 23, 2019.

*Primary Examiner* — Ismail A Muse
(74) *Attorney, Agent, or Firm* — Qualcomm Incorporated/Seyfarth Shaw LLP

(57) ABSTRACT

An integrated circuit includes a capacitor (e.g., a folded metal-oxide-metal (MOM) capacitor) formed in the lower BEOL interconnect levels, without degrading an inductor's Q-factor. The integrated circuit includes the capacitor in one or more back-end-of-line (BEOL) interconnect levels. The capacitor includes multiple folded capacitor fingers having multiple sides and a pair of manifolds on a same side of the folded capacitor fingers. Each of the pair of manifolds is coupled to one or more of the folded capacitor fingers. The integrated circuit also includes an inductive trace having one or more turns in one or more different BEOL interconnect levels. The inductive trace overlaps one or more portions of the capacitor.

16 Claims, 8 Drawing Sheets

(51) Int. Cl.
*H01L 23/528* (2006.01)
*H01L 49/02* (2006.01)
*H03H 1/00* (2006.01)

(52) U.S. Cl.
CPC .............. *H01L 28/10* (2013.01); *H01L 28/40* (2013.01); *H03H 1/0007* (2013.01); *H03H 2001/0021* (2013.01)

(56) References Cited

U.S. PATENT DOCUMENTS

| | | |
|---|---|---|
| 7,495,566 B2 | 2/2009 | Jorgensen et al. |
| 7,811,919 B2 | 10/2010 | Daley et al. |
| 7,906,831 B2 | 3/2011 | Baumgartner et al. |
| 8,441,334 B2 * | 5/2013 | Kawano ................. H01F 21/02 336/200 |
| 9,270,247 B2 | 2/2016 | Jing et al. |
| 9,443,843 B2 | 9/2016 | Lee et al. |
| 2007/0268653 A1 | 11/2007 | Kim et al. |
| 2008/0055037 A1 * | 3/2008 | Watanabe ........... H01F 17/0006 336/200 |
| 2008/0151469 A1 * | 6/2008 | Thompson ............. H01G 4/232 361/303 |
| 2009/0032904 A1 * | 2/2009 | Chinthakindi ...... H01L 23/5223 257/532 |
| 2009/0322447 A1 * | 12/2009 | Daley ................ H01L 23/5223 333/185 |
| 2010/0019300 A1 | 1/2010 | Yu et al. |
| 2012/0098621 A1 * | 4/2012 | Nathawad ........... H01L 23/5225 333/175 |
| 2012/0223796 A1 * | 9/2012 | Huang ................... H01F 21/12 336/142 |
| 2013/0043557 A1 | 2/2013 | Cho |
| 2013/0093045 A1 | 4/2013 | Cho |
| 2014/0138792 A1 * | 5/2014 | Lo ........................ H01L 23/645 257/531 |
| 2014/0167992 A1 | 6/2014 | Aruga |
| 2017/0093362 A1 | 3/2017 | Jin et al. |
| 2017/0149404 A1 * | 5/2017 | Tsai ................... H01L 23/5223 |
| 2017/0222613 A1 * | 8/2017 | Yehezkely ........... H03H 7/0115 |
| 2018/0102738 A1 * | 4/2018 | Bi ........................ H03B 5/1243 |
| 2018/0323765 A1 * | 11/2018 | Armanious ............... H01P 7/08 |
| 2019/0007017 A1 * | 1/2019 | Yehezkely ........... H03H 7/0115 |
| 2019/0051987 A1 * | 2/2019 | Blumberg, Jr. ....... H01Q 1/2225 |
| 2019/0189608 A1 * | 6/2019 | Cheng ................... H01L 21/705 |
| 2019/0200454 A1 * | 6/2019 | Liu ....................... H03H 7/0115 |
| 2019/0229699 A1 * | 7/2019 | Joshi ....................... H01L 28/40 |
| 2019/0378793 A1 * | 12/2019 | Cheng ..................... H01L 21/74 |

FOREIGN PATENT DOCUMENTS

| | | |
|---|---|---|
| WO | 0178119 A2 | 10/2001 |
| WO | 2005008695 A2 | 1/2005 |
| WO | 2017053120 A1 | 3/2017 |

* cited by examiner

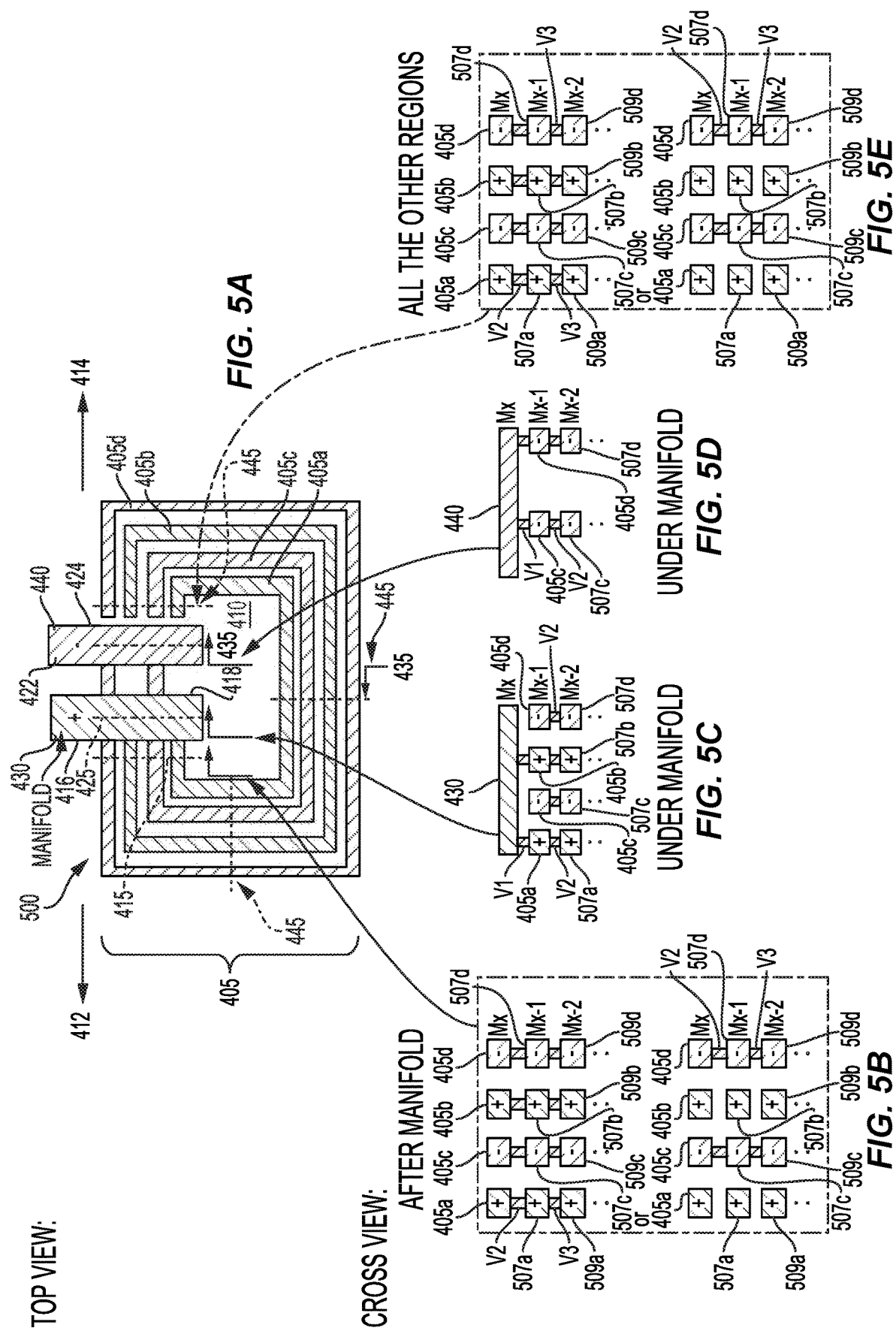

600

602

FABRICATE A CAPACITOR IN ONE OR MORE
BACK-END-OF-LINE (BEOL) INTERCONNECT LEVELS;

THE CAPACITOR HAS MULTIPLE FOLDED CAPACITOR FINGERS INCLUDING
MULTIPLE SIDES AND A PAIR OF MANIFOLDS ON A SAME SIDE OF THE
FOLDED CAPACITOR PILLARS;

EACH OF THE PAIR OF MANIFOLDS IS COUPLED TO ONE
OR MORE OF THE FOLDED CAPACITOR FINGERS

604

FABRICATE AN INDUCTIVE TRACE HAVING ONE OR MORE TURNS
IN ONE OR MORE DIFFERENT BEOL INTERCONNECT LEVELS;

THE INDUCTIVE TRACE OVERLAPS ONE OR
MORE PORTIONS OF THE CAPACITOR

*FIG. 6*

FOLDED METAL-OXIDE-METAL CAPACITOR OVERLAPPED BY ON-CHIP INDUCTOR/TRANSFORMER

CROSS-REFERENCE TO RELATED APPLICATION

The present application claims the benefit of U.S. Provisional Patent Application No. 62/632,692, filed on Feb. 20, 2018, and titled "FOLDED METAL-OXIDE-METAL CAPACITOR OVERLAPPED BY ON-CHIP INDUCTOR/TRANSFORMER," the disclosure of which is expressly incorporated by reference herein in its entirety.

BACKGROUND

Field

Aspects of the present disclosure relate to semiconductor devices and, more particularly, to a folded metal-oxide-metal (MOM) capacitor that overlaps an on-chip inductor/transformer.

Background

Mobile radio frequency (RF) chips (e.g., mobile RF transceivers) have migrated to a deep sub-micron process node due to cost and power consumption considerations. Designing mobile RF transceivers is further complicated by added circuit functions for supporting communication enhancements, such as carrier aggregation. Further design challenges for mobile RF transceivers include using passive devices, which directly affect analog/RF performance considerations, including mismatch, noise, and other performance considerations.

Passive devices may involve high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. MOM capacitors are also known as vertical parallel plate (VPP) capacitors, natural vertical capacitors (NVCAP), lateral flux capacitors, comb capacitors, as well as interdigitated finger capacitors. MOM capacitors exhibit beneficial characteristics including high capacitance density, low parasitic capacitance, superior RF characteristics, and good matching characteristics without additional masks or process steps relative to other capacitor structures.

MOM capacitors are one of the most widely used capacitors due to their beneficial characteristics. MOM capacitor structures realize capacitance by using the fringing capacitance produced by sets of interdigitated fingers. For example, MOM capacitors harness lateral capacitive coupling between plates formed by metallization layers and wiring traces.

The design of mobile RF transceivers may include integrating MOM capacitors with inductors and/or transformers. Unfortunately, integrating MOM capacitors with inductors and/or transformers may degrade a performance of the inductors and/or transformers.

SUMMARY

An integrated circuit may include a capacitor in one or more back-end-of-line (BEOL) interconnect levels. The capacitor includes multiple folded capacitor fingers having multiple sides and a pair of manifolds on a same side of the folded capacitor fingers. Each of the pair of manifolds is coupled to one or more of the folded capacitor fingers. The integrated circuit also includes an inductive trace having one or more turns in one or more different BEOL interconnect levels. The inductive trace overlaps one or more portions of the capacitor.

A method of fabricating an integrated circuit may include fabricating a capacitor in one or more back-end-of-line (BEOL) interconnect levels. The capacitor includes multiple folded capacitor fingers having multiple sides and a pair of manifolds on a same side of the multiple sides of the folded capacitor fingers. Each of the pair of manifolds is coupled to one or more of the folded capacitor fingers. The method also includes fabricating an inductive trace having one or more turns in one or more different BEOL interconnect levels. The inductive trace overlaps one or more portions of the capacitor.

An integrated circuit may include a capacitor in one or more back-end-of-line (BEOL) interconnect levels. The capacitor includes multiple folded capacitor fingers having multiple sides and a pair of manifolds on a same side of the folded capacitor fingers. Each of the pair of manifolds is coupled to one or more of the folded capacitor fingers. The integrated circuit also includes means for storing electrical energy in a magnetic field within one or more different BEOL interconnect levels. The electrical energy storing means overlaps one or more portions of the capacitor.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A-5E illustrate a top view and multiple cross-sectional views of a folded metal-oxide-metal (MOM) capacitor, according to aspects of the present disclosure.

FIG. 6 is a process flow diagram illustrating a method for fabricating a folded metal-oxide-metal (MOM) capacitor that overlaps an on-chip inductor/transformer, according to an aspect of the present disclosure.

DETAILED DESCRIPTION

Figure 1:
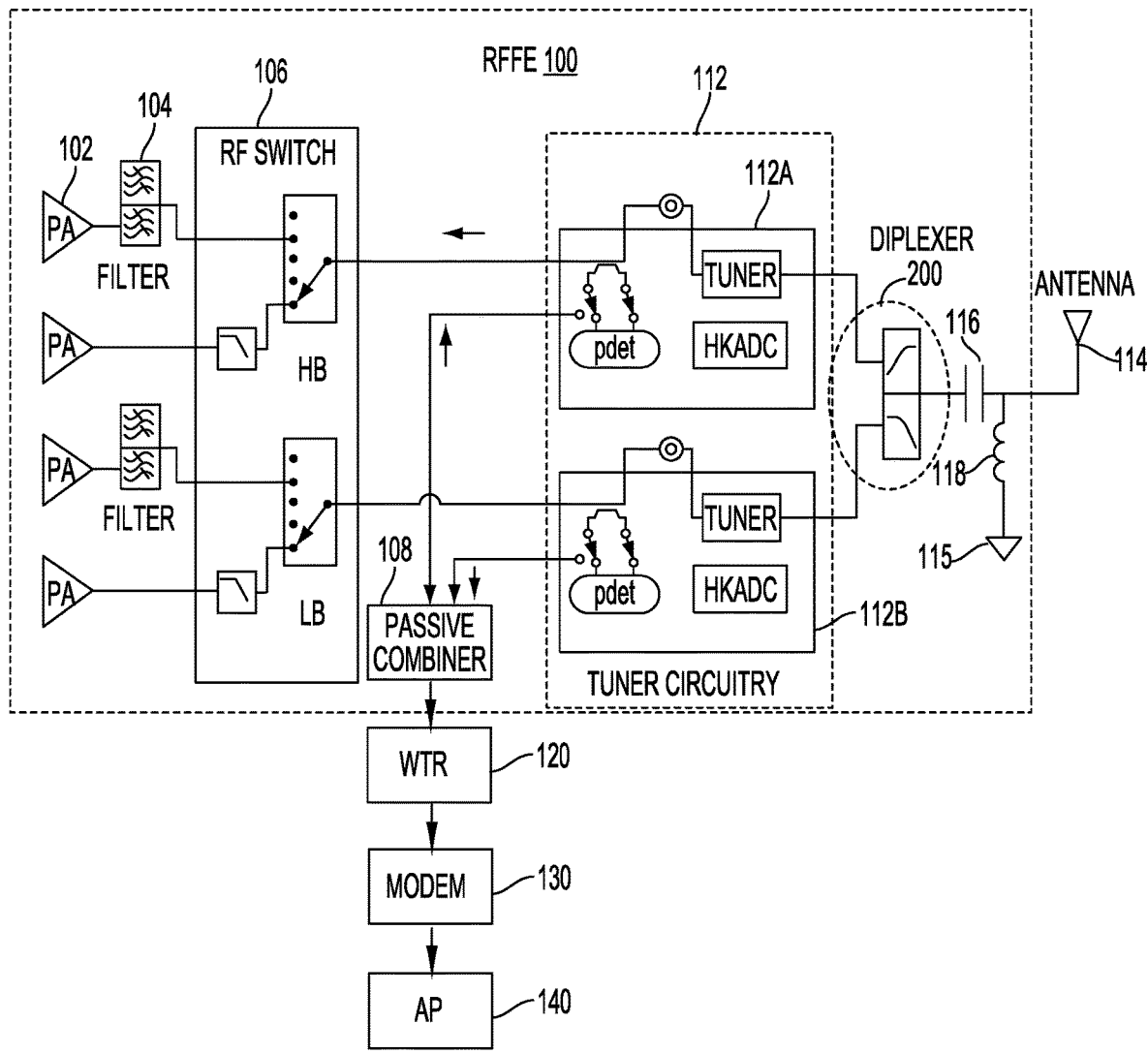
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Passive devices in mobile RF transceivers may include high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

These parallel plate capacitors consume a large area on a semiconductor chip because many designs place the capacitor over the substrate of the chip. Unfortunately, this approach reduces the available area for active devices. Another approach is to create a vertical structure, which may be known as a vertical parallel plate (VPP) capacitor. VPP capacitor structures may be created through stacking interconnect layers on a chip.

VPP capacitors structures, however, have lower capacitive storage, or lower "density," in that these structures do not store much electrical charge. In particular, the interconnect and via layer interconnect traces used to fabricate VPP capacitors may be very small in size. The spacing between the interconnects and via layer conductive traces in VPP structures is limited by design rules, which often results in a large area for achieving certain desired capacitance for such structures. Although described as "vertical," these structures can be in any direction that is substantially perpendicular to the surface of the substrate, or at other angles that are not substantially parallel to the substrate.

A MOM capacitor as well as a MOS capacitor are examples of VPP capacitors. MOM capacitors are one of the most widely used capacitors due to their beneficial characteristics. In particular, MOM capacitors are typically used for providing high quality capacitors in semiconductor processes without incurring the cost of an extra processing step relative to other capacitor structures. MOM capacitor structures realize capacitance by using the fringing capacitance produced by sets of interdigitated fingers. That is, MOM capacitors harness lateral capacitive coupling between plates formed by metallization layers and wiring traces.

The design of mobile RF transceivers may include integrating MOM capacitors with inductors and/or transformers. Unfortunately, integrating MOM capacitors with inductors and/or transformers may degrade performance of the inductors and/or transformers. Consequently, conventional arrangements for implementing multi-turn inductors continue to consume unused area in RF integrated circuit (RFIC) analog devices.

Various aspects of the present disclosure provide a capacitor integrated within an inductor area, which is conventionally unused. The process flow for fabrication of the capacitor and inductor may include front-end-of-line (FEOL) processes, middle-of-line (MOL) processes, and back-end-of-line (BEOL) processes.

As described, the back-end-of-line interconnect layers may refer to the conductive interconnect layers (e.g., a first interconnect layer (M1) or metal one M1, metal two (M2), metal three (M3), metal four (M4), etc.) for electrically coupling to front-end-of-line active devices of an integrated circuit. The various back-end-of-line interconnect layers are formed at corresponding back-end-of-line interconnect levels, in which lower back-end-of-line interconnect levels use thinner metals layers relative to upper back-end-of-line interconnect levels. The back-end-of-line interconnect layers may electrically couple to middle-of-line interconnect layers, for example, to connect M1 to an oxide diffusion (OD) layer of an integrated circuit. The middle-of-line interconnect layer may include a zero interconnect layer (M0) for connecting M1 to an active device layer of an integrated circuit. A back-end-of-line first via (V2) may connect M2 to M3 or others of the back-end-of-line interconnect layers. It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

In practice, inductors/transformers are commonly used in radio frequency integrated circuits (RFICs). These inductors/transformers are generally formed at the upper back-end-of-line (BEOL) interconnect levels because the upper BEOL interconnect levels provide thick metal layers for achieving a desired inductance. These inductors/transformers, however, occupy significant semiconductor area due to the thick metal layers provided by the upper BEOL interconnect levels. Unfortunately, adding circuits/capacitors below these inductors/capacitors normally decreases an inductor quality (Q)-factor.

Aspects of the present disclosure describe a capacitor formed in an area below the inductors/transformers, while maintaining an inductor's Q-factor. For example, the inductor may be fabricated at the upper BEOL interconnect level (e.g., M5). Conventionally, the area in a lower BEOL interconnect level (e.g., M1-M4) is unused because occupying this area generally degrades the inductor's Q-factor.

According to aspects of the present disclosure, a capacitor (e.g., a folded metal-oxide-metal (MOM) capacitor) may be formed in the lower BEOL interconnect levels, without degrading the inductor's Q-factor. In some aspects, an integrated circuit may include the capacitor in at least one back-end-of-line (BEOL) interconnect level. The capacitor may have a pair of capacitor routing terminals (or capacitor terminals) on a same side of the capacitor. For example, the capacitor may have four sides and a fourth side of the capacitor may include the pair of capacitor routing terminals. Each of the pair of capacitor routing terminals may be coupled to multiple folded capacitor routing traces (or folded capacitor fingers). The integrated circuit includes an inductive trace (e.g., an inductor trace or a transformer trace) that has one or more turns in at least one different BEOL interconnect level. The inductive trace overlaps one or more portions of the capacitor. For example, a perimeter defined by the inductive trace of the inductor may include the multiple folded capacitor routing traces while the inductive trace overlaps the pair of capacitor routing terminals (e.g., endcaps or manifolds).

In one aspect of the disclosure, a capacitor terminal of a first polarity (e.g., positive) is coupled to a first set of folded capacitor routing traces of the multiple folded capacitor routing traces. Some of the traces may directly contact the capacitor terminal while other traces may connect through one or more vias. A capacitor terminal of a second polarity (e.g., negative) is coupled to a second set of folded capacitor routing traces of the multiple folded capacitor routing traces by one or more vias.

A first folded capacitor routing trace of the first set of folded capacitor routing traces is coupled to a second folded capacitor routing trace of the first set of folded capacitor routing traces on a different interconnect level by at least one first via. A third folded capacitor routing trace of the second set of folded capacitor routing traces is coupled to a fourth folded capacitor routing trace of the second set of folded capacitor routing traces on a different interconnect level by at least one second via.

In one aspect of the disclosure, a first capacitor terminal of the first polarity (e.g., positive) is coupled to one or more folded capacitor routing traces of the first set of folded capacitor routing traces only on a first side facing a first direction. A second capacitor terminal of the second polarity (e.g., negative) is coupled to one or more folded capacitor routing traces of the second set of folded capacitor routing traces only on a first side facing the first direction.

FIG. 1 is a schematic diagram of a radio frequency (RF) front end (RFFE) module 100 employing passive devices including a capacitor 116 (e.g., a folded metal-oxide-metal capacitor) integrated within an inductor area of an inductor 118. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog-to-digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are contemplated.

Figure 2:
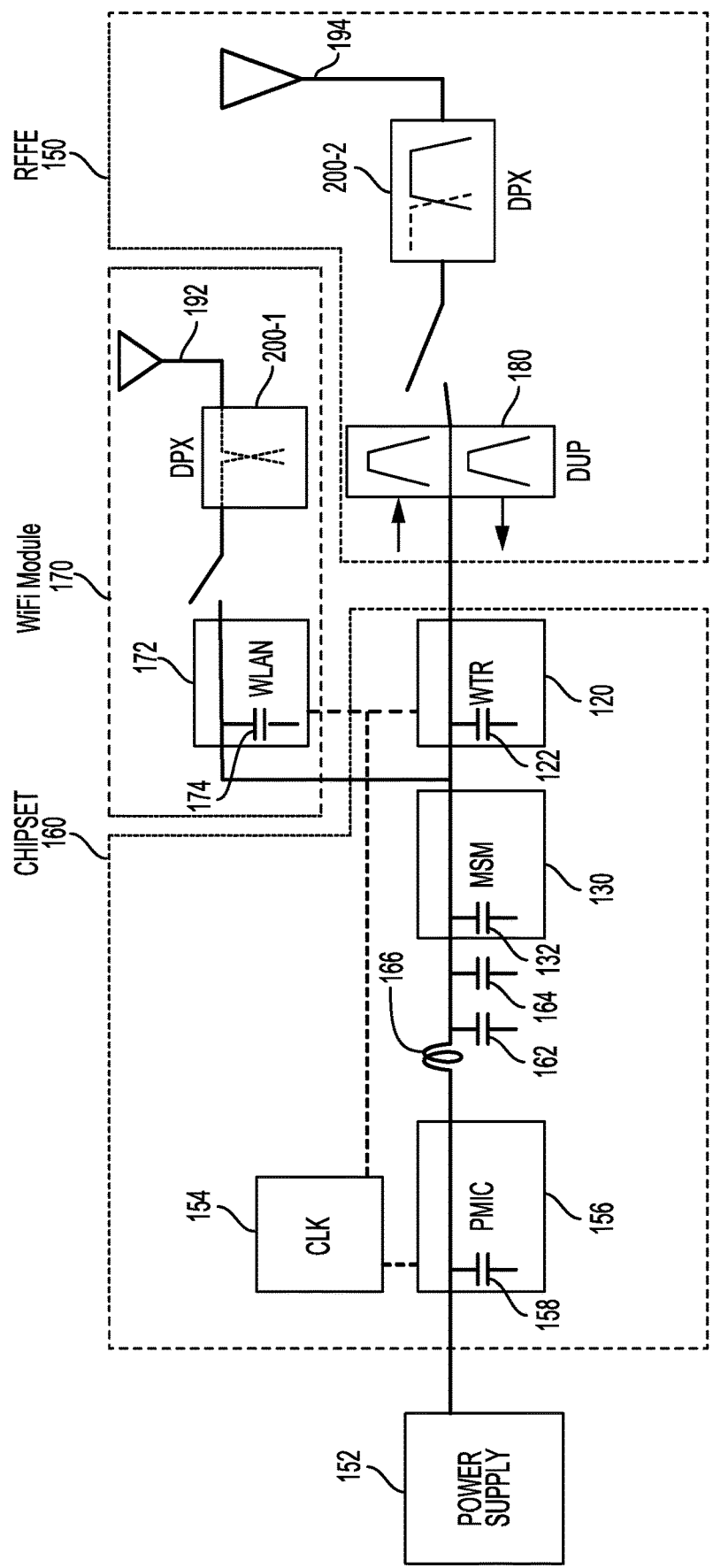
FIG. 2 is a schematic diagram of a radio frequency (RF) front end (RFFE) module employing passive devices for a chipset.

FIG. 2 is a schematic diagram of a wireless local area network (WLAN) (e.g., WiFi) module 170 including a first diplexer 200-1 and an RF front end (RFFE) module 150 including a second diplexer 200-2 for a chipset 160, including a folded MOM capacitor integrated within an inductor area. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 includes capacitors 162 and 164, as well as an inductor(s) 166 to provide signal integrity.

The PMIC 156, the modem 130, the wireless transceiver 120, and the WLAN module 172 each include capacitors (e.g., 158, 132, 122, and 174) and operate according to a clock 154. In addition, the inductor 166 couples the modem 130 to the PMIC 156. The geometry and arrangement of the various capacitors and inductor in the chipset 160 may consume substantial chip area. The design of the chipset 160 likely includes integrating MOM/MIM/MOS capacitors with inductors and/or transformers. Unfortunately, integrating MOM/MIM/MOS capacitors with inductors and/or transformers may degrade performance of the inductors and/or transformers. Consequently, conventional arrangements for implementing multi-turn inductors continue to consume unused area in RF integrated circuit (RFIC) analog devices.

Figure 3:
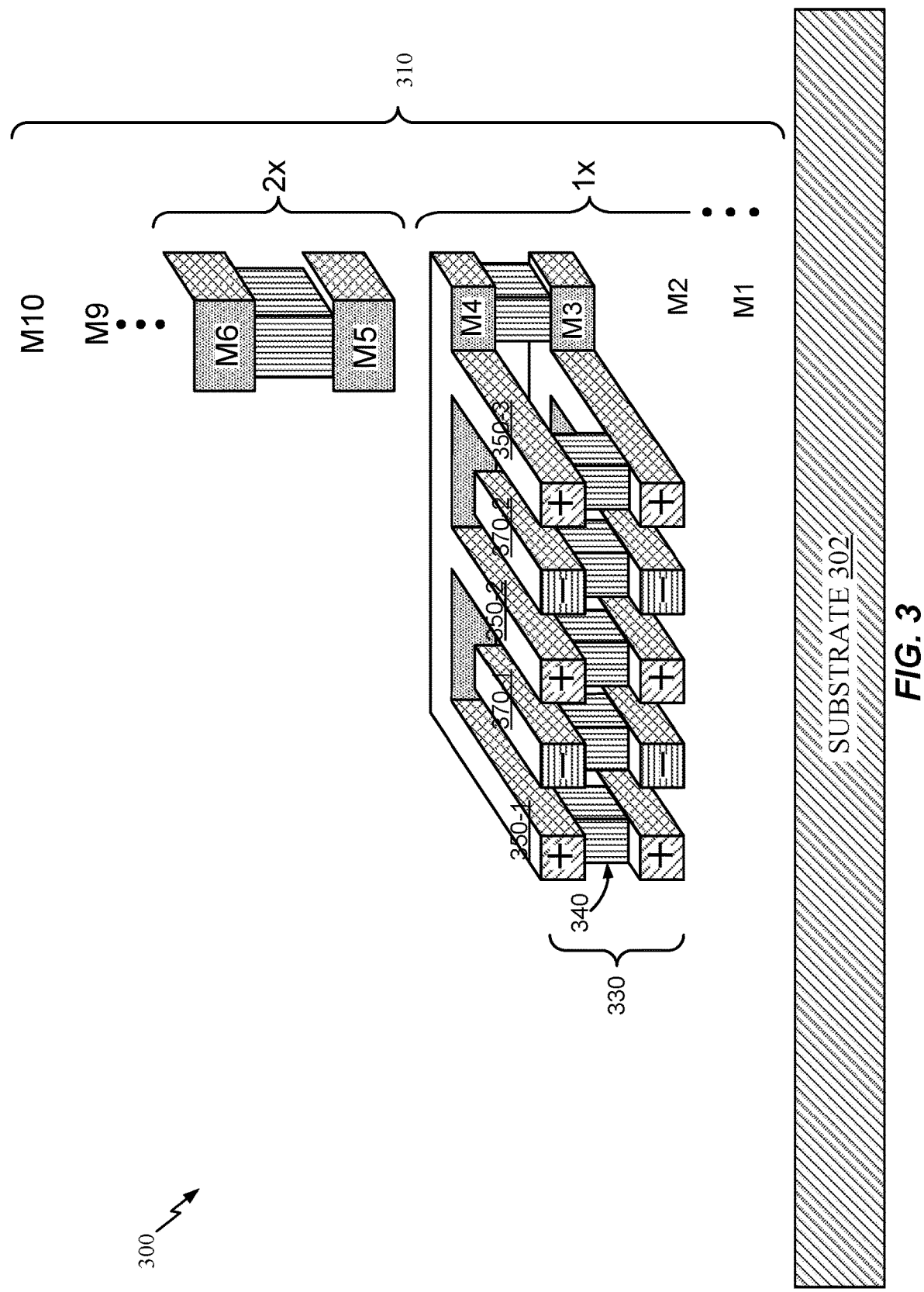
FIG. 3 is a cross-section illustrating an integrated circuit (IC) device including an interconnect stack that contains conventional metal-oxide-metal (MOM) capacitor structures.

Capacitors are widely used in analog integrated circuits. FIG. 3 is a block diagram illustrating a cross-section of an analog integrated circuit (IC) device 300 including an interconnect stack 310. The interconnect stack 310 of the IC device 300 includes multiple conductive interconnect layers (M1, . . . , M9, M10) on a semiconductor substrate (e.g., a diced silicon wafer) 302. The semiconductor substrate 302 support a metal-oxide-metal (MOM) capacitor 330 and/or a metal-oxide-semiconductor (MOS). In this example, the MOM capacitor 330 is formed in the M3 and M4 interconnect layers, below the M5 and M6 interconnect layers. The MOM capacitor 330 is formed from lateral conductive fingers of different polarities using the conductive interconnect layers (M3 and M4) of the interconnect stack 310. A dielectric (not shown) is provided between the conductive fingers.

In this example, the MOM capacitor 330 is formed within the lower conductive interconnect layers (e.g., M1-M4) of the interconnect stack 310. The lower conductive interconnect layers of the interconnect stack 310 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 3, the MOM capacitor 330 makes use of a lateral (intra layer) capacitive coupling 340 between fingers (e.g., 350, 370) formed by standard metallization of the conductive interconnects (e.g., wiring lines and vias). In aspects of the present disclosure, the folded MOM capacitor may be integrated within an inductor area, as shown in FIG. 4.

Figure 4:
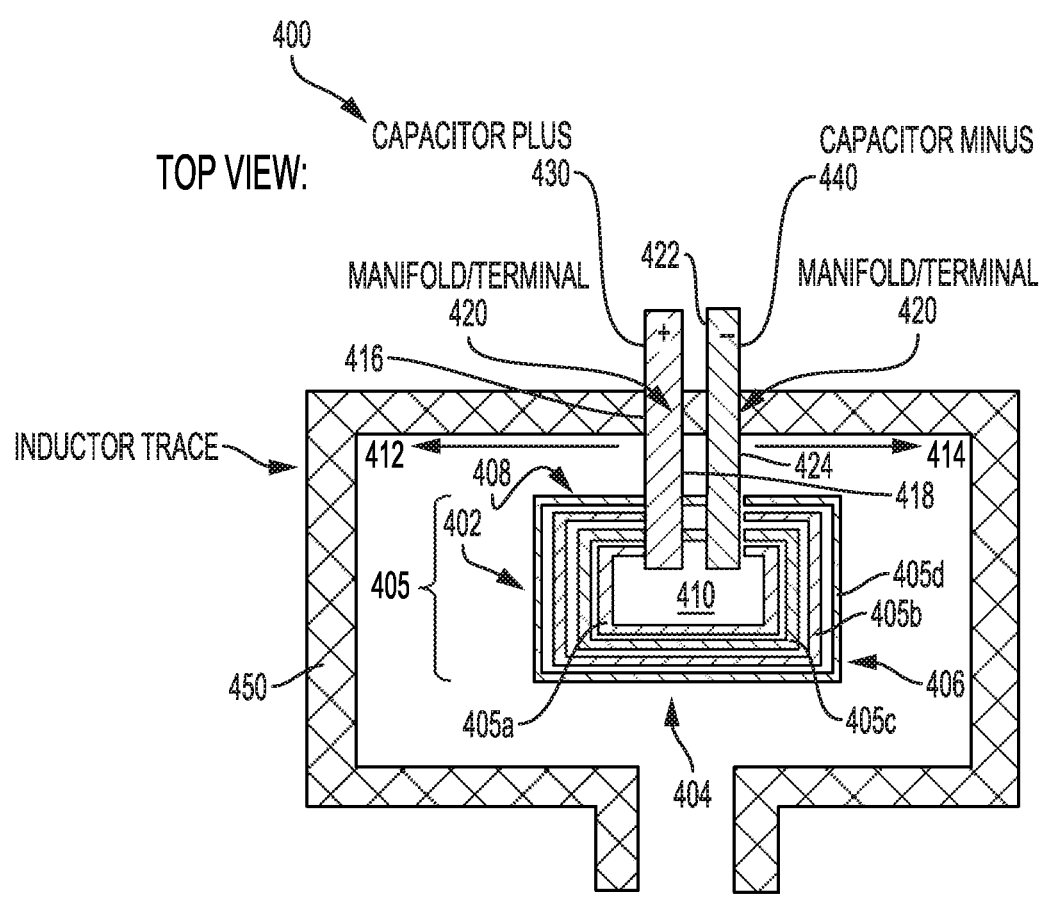
FIG. 4 is a schematic diagram illustrating a top view of a folded metal-oxide-metal (MOM) capacitor that overlaps an on-chip inductor/transformer, according to aspects of the present disclosure.

FIG. 4 is a schematic diagram illustrating a top view of a folded metal-oxide-metal (MOM) capacitor that overlaps an on-chip inductor/transformer, according to aspects of the present disclosure. An integrated circuit 400 (e.g., a radio frequency integrated circuit (RFIC)) includes an on-chip inductor/transformer that is shown as a one turn inductive trace (e.g., inductor trace) 450 formed in an upper back-end-of-line (BEOL) interconnect level (e.g., M5-M8). For example, the upper BEOL interconnect level may begin at a fifth BEOL interconnect level (M5). A capacitor 410 is fabricated in lower BEOL interconnect levels (e.g., M1-M4). For example, the lower BEOL interconnect levels may begin at a first BEOL interconnect level (M1). Although the upper and lower BEOL interconnect levels are described with reference to particular BEOL interconnect levels, it should be understood that other ranges are contemplated, according to aspects of the present disclosure.

The capacitor 410 may have a pair of capacitor routing terminals or manifolds 420 on a same side of the capacitor 410. For example, the capacitor 410 may have four sides (e.g., a first side 402, a second side 404, a third side 406, and a fourth side 408) where the fourth side 408 of the capacitor 410 includes the pair of capacitor routing terminals 420. Each of the pair of capacitor routing terminals 420 may be coupled to multiple folded capacitor routing traces 405 (or folded capacitor fingers).

The integrated circuit 400 includes the inductive trace 450 (e.g., an inductor trace or a transformer trace) that has one or more turns in at least one different BEOL interconnect level. The inductive trace 450 overlaps one or more portions of the capacitor 410. For example, a perimeter defined by the inductive trace 450 of the inductor may include the multiple folded capacitor routing traces 405 while the inductive trace 450 overlaps the pair of capacitor routing terminals 420. The capacitor terminals 430 and 440 (e.g., endcaps or manifolds) can be above, below or on a same layer as the inductor trace 450. For example, a majority of the inductor trace 450 can be on a same level as the capacitor terminals 430 and 440. A layer cross or bridge at another layer could be employed in the small overlapping area. For example, the inductor traces can change from M5 to M6, allowing the manifolds to remain on layer M5.

In one aspect of the disclosure, a first capacitor terminal 430 of a first polarity (e.g., positive) is coupled to a first set of folded capacitor routing traces (e.g., a first folded capacitor routing trace 405a and a second folded capacitor routing trace 405b) of the multiple folded capacitor routing traces 405 by one or more vias (not shown). A second capacitor terminal 440 of a second polarity (e.g., negative) is coupled to a second set of folded capacitor routing traces (e.g., a third folded capacitor routing trace 405c and a fourth folded capacitor routing trace 405d) of the multiple folded capacitor routing traces 405 by one or more vias (not shown). It should be recognized that the number of multiple folded capacitor routing traces 405 shown is merely exemplary, as more or fewer folded capacitor routing traces are contemplated, according to aspects of the present disclosure.

In addition to or instead of being connected with vias, the first capacitor terminal 430 of the first polarity (e.g., positive) is coupled to one or more folded capacitor routing traces (e.g., the first folded capacitor routing trace 405a and the second folded capacitor routing trace 405b) of the first set of folded capacitor routing traces on a first side 416 facing a first direction 412. The second capacitor terminal 440 of the second polarity (e.g., negative) is coupled to one or more folded capacitor routing traces (e.g., the third folded capacitor routing trace 405c and the fourth folded capacitor routing trace 405d) of the second set of folded capacitor routing traces on a second side 422 facing the first direction 412. For example, a third side 418 of the first capacitor terminal 430 facing a direction 414 is not coupled to the folded capacitor routing traces 405. Similarly, a fourth side 424 of the second capacitor terminal 440 facing the direction 414 is not coupled to the folded capacitor routing traces 405.

This arrangement of the capacitor terminals (e.g., 430, 440) prevents the capacitor 410 from negatively affecting the Q-factor of the inductor trace 450 by avoiding formation of a loop current (e.g., loop eddy current) within the capacitor 410 when the first capacitor terminal 430 of the first polarity (e.g., positive) and the second capacitor terminal 440 of the second polarity (e.g., negative) are proximate to each other on a same side (e.g., the fourth side 408 of the capacitor 410). The formation of the loop current can also be avoided by preventing one side of each of the capacitor terminals (e.g., 430, 440) from contacting the folded capacitor routing traces. For example, the fourth side 424 of the second capacitor terminal 440 facing the direction 414 is not coupled to the folded capacitor routing traces 405. Similarly, the third side 418 of the first capacitor terminal 430 facing a direction 414 is not coupled to the folded capacitor routing traces 405.

FIGS. 5A-5E illustrate a top view and various cross sectional views of a folded metal-oxide-metal (MOM) capacitor 500, according to aspects of the present disclosure. For illustrative purposes, some of the labelling and numbering of the devices and features of FIGS. 5A-5E are similar to those of FIG. 4.

The multiple cross-sectional views include a first cross-section and second cross-section (FIG. 5B), a third cross-section (FIG. 5C), a fourth cross-section (FIG. 5D), a fifth cross-section and a sixth cross-section (FIG. 5E). For example, the first cross-section (upper portion of FIG. 5B) may correspond to a first cross-sectional line 415 in the direction 412 after the first capacitor terminal 430. Similarly, the second cross-section (lower portion of FIG. 5B) illustrates an alternative implementation of the first cross-section and may also correspond to the first cross-sectional line 415 in the direction 412 after the first capacitor terminal 430. The third cross-section (FIG. 5C) corresponds to a cross-sectional line 425 through the first capacitor terminal 430. The fourth cross-section (FIG. 5D) corresponds to a cross-sectional line 435 through the second capacitor terminal 440. The fifth cross-section (upper portion of FIG. 5E) may correspond to the cross-sectional line(s) 445 in the direction 414 after the second capacitor terminal 440. The sixth cross-section (lower portion of FIG. 5E) illustrates an alternative implementation of the fifth cross-section and may also correspond to the cross-sectional line(s) 445 in the direction 414 after the second capacitor terminal 440.

Each of the cross-sections illustrates multiple conductive interconnect layers (e.g., a first conductive interconnect layer Mx, a second conductive interconnect layer Mx-1, and/or a third conductive interconnect layer Mx-2). A first conductive interconnect layer for one cross section may be the same or different from a first conductive interconnect layer of a different cross section. For example, the first conductive interconnect layer Mx of the first, second, fifth, and sixth cross-sections are the same. This also applies to subsequent conductive interconnect layers (e.g., Mx-1 and Mx-2) of the first, second, fifth, and sixth cross-sections. The first conductive interconnect layer Mx of the third and fourth cross-sections are the same. This also applies to subsequent conductive interconnect layers (e.g., Mx-1 and Mx-2) of the third and fourth cross-sections.

The first cross-section, the second cross-section, the fifth cross-section and the sixth cross-section (FIGS. 5B and 5E) include the first set of folded capacitor routing traces (e.g., the first folded capacitor routing trace 405*a* and the second folded capacitor routing trace 405*b*) within the first conductive interconnect layer Mx. The first cross-section, the second cross-section, the fifth cross-section and the sixth cross-section also include the second set of folded capacitor routing traces (e.g., the third folded capacitor routing trace 405*c* and the fourth folded capacitor routing trace 405*d*) within the first conductive interconnect layer Mx.

The first cross-section, the second cross-section, the fifth cross-section and the sixth cross-section (FIGS. 5B and 5E) also include the first set of folded capacitor routing traces (e.g., a first folded capacitor routing trace 507*a* and a second folded capacitor routing trace 507*b*) within the second conductive interconnect layer Mx-1. The first cross-section, the second cross-section, the fifth cross-section and the sixth cross-section also include the second set of folded capacitor routing traces (e.g., a third folded capacitor routing trace 507*c* and a fourth folded capacitor routing trace 507*d*) within the second conductive interconnect layer Mx-1.

The first cross-section, the second cross-section, the fifth cross-section, and the sixth cross-section (FIGS. 5B and 5E) further include the first set of folded capacitor routing traces (e.g., a first folded capacitor routing trace 509*a* and a second folded capacitor routing trace 509*b*) within the third conductive interconnect layer Mx-2. The first cross-section, the second cross-section, the fifth cross-section, and the sixth cross-section also include the second set of folded capacitor routing traces (e.g., a third folded capacitor routing trace 509*c* and a fourth folded capacitor routing trace 509*d*) within the third conductive interconnect layer Mx-2.

The third cross-section (FIG. 5C) includes the first capacitor terminal 430 of the first polarity (e.g., positive) within the first layer Mx and the fourth cross-section (FIG. 5D) includes the second capacitor terminal 440 of the second polarity (e.g., negative) within the first layer Mx. The third cross-section (FIG. 5C) includes the first set of folded capacitor routing traces (e.g., the first folded capacitor routing trace 405*a* and the second folded capacitor routing trace 405*b*) within the second conductive interconnect layer Mx-1. The third cross-section and the fourth cross-section include the second set of folded capacitor routing traces (e.g., the third folded capacitor routing trace 405*c* and the fourth folded capacitor routing trace 405*d*) within the second conductive interconnect layer Mx-1.

The third cross-section (FIG. 5C) further includes the first set of folded capacitor routing traces (e.g., the first folded capacitor routing trace 507*a* and the second folded capacitor routing trace 507*b*) within the third conductive interconnect layer Mx-2. The third cross-section and the fourth cross-section (FIGS. 5C and 5D) include the second set of folded capacitor routing traces (e.g., the third folded capacitor routing trace 507*c* and the fourth folded capacitor routing trace 507*d*) within the third conductive interconnect layer Mx-2.

One or more vias V1, V2, and/or V3 may couple the traces and/or terminals between the various conductive interconnect layers. In some aspects, the first set of folded capacitor routing traces of the first polarity are coupled to each other by vias while the second set of folded capacitor routing traces of the second polarity are coupled to each other by vias. The first set of folded capacitor routing traces of the first polarity are coupled to the first capacitor terminal 430 of the first polarity by vias and also directly at the first side 416 in layer Mx. The second set of folded capacitor routing traces of the second polarity are coupled to the second capacitor terminal 440 of the second polarity by vias and also directly at the second side 422 in layer Mx. After a small distance in the direction of 412, the layer Mx is diverted or rerouted to other layers using vias, for example, to bypass obstacles (e.g., the first capacitor terminal 430) and to allow negative traces on layers Mx-1 and Mx-2 to pass under the first capacitor terminal 430, as shown in FIG. 5C. The diversion or routing may be achieved using vias that couple traces from one layer to traces in another layer.

In case the manifolds extend to multiple levels (e.g., Mx and Mx-1) the multiple levels can be connected with vias. In this case, the traces at the same level as the manifold connect to the manifolds directly at that level. The via connections underneath the manifolds from the traces at lower levels are optional.

For example, the first cross-section and the fifth cross-section (FIGS. 5B and 5E upper sections) illustrate the first folded capacitor routing trace 405*a* of the first conductive interconnect layer Mx is coupled to the first folded capacitor routing trace 507a of the second conductive interconnect layer Mx-1 by a via V2. The first cross-section and the fifth cross-section also illustrate that the first folded capacitor routing trace 507a of the second conductive interconnect layer Mx-1 is coupled to the first folded capacitor routing trace 509a of the third conductive interconnect layer Mx-2 by a via V3.

Similarly, the first cross-section and the fifth cross-section illustrate that the third folded capacitor routing trace 405c of the first conductive interconnect layer Mx is coupled to the third folded capacitor routing trace 507c of the second conductive interconnect layer Mx-1 by a via (e.g., via V2). The first cross-section and the fifth cross-section also illustrate that the third folded capacitor routing trace 507c of the second conductive interconnect layer Mx-1 is coupled to the third folded capacitor routing trace 509c of the third conductive interconnect layer Mx-2 by a via (e.g., via V3).

Alternatively, as illustrated by the second cross-section (lower portion of FIG. 5B) and the sixth cross-section (lower portion of FIG. 5E), the first folded capacitor routing trace 405a of the first conductive interconnect layer Mx, the first folded capacitor routing trace 507a of the second conductive interconnect layer Mx-1 and the first folded capacitor routing trace 509a of the third conductive interconnect layer Mx-2 may not be coupled to each other with vias, except when under the manifold 430.

Alternatively, as illustrated by the sixth cross-section, the third folded capacitor routing trace 405c of the first conductive interconnect layer Mx, the third folded capacitor routing trace 507c of the second conductive interconnect layer Mx-1 and the third folded capacitor routing trace 509c of the third conductive interconnect layer Mx-2 may not be coupled to each other with vias, except when under the manifolds 430, 440.

The first set of folded capacitor routing traces of the first polarity are coupled to the first capacitor terminal 430 by vias. For example, the third cross-section (FIG. 5C) illustrates that the first folded capacitor routing trace 405a of the second conductive interconnect layer Mx-1 and the first folded capacitor routing trace 507a of the third conductive interconnect layer Mx-2 are coupled to the first capacitor terminal 430 of the first conductive interconnect layer Mx by vias (e.g., V1 and V2). The third folded capacitor routing trace 405c of the second conductive interconnect layer Mx-1 and the third folded capacitor routing trace 507c of the third conductive interconnect layer Mx-2, however, are not coupled to the first capacitor terminal 430.

The second set of folded capacitor routing traces of the second polarity are coupled to the second capacitor terminal 440 by vias. For example, the fourth cross-section (FIG. 5D) illustrates that the third folded capacitor routing trace 405c of the second conductive interconnect layer Mx-1 and the third folded capacitor routing trace 507c of the third conductive interconnect layer Mx-2 are coupled to the second capacitor terminal 440 of the first conductive interconnect layer Mx by vias (e.g., V1 and V2).

FIG. 6 is a process flow diagram illustrating a method 600 for fabricating a capacitor (e.g., metal-oxide-metal (MOM) capacitor) that overlaps an on-chip inductor/transformer, according to an aspect of the present disclosure. In block 602, a capacitor in one or more back-end-of-line (BEOL) interconnect levels is fabricated. The capacitor includes multiple folded capacitor fingers and a pair of manifolds. The manifolds are on a same side of the folded capacitor fingers. For example, the fingers are folded into multiple sides and the manifolds are on one of those sides. Each of the pair of manifolds is coupled to one or more of the folded capacitor fingers. For example, as shown in FIG. 4, one or more portions of the capacitor 410 is fabricated within an inductor area defined by a perimeter of an inductive trace 450.

In block 604, an inductive trace having one or more turns is fabricated in one or more different BEOL interconnect levels. The inductive trace overlaps one or more portions of the capacitor. For example, as shown in FIG. 4, the inductive trace 450 overlaps the pair of capacitor routing terminals or manifolds 420 of the capacitor 410.

According to a further aspect of the present disclosure, an integrated circuit includes a capacitor within an inductor area defined by a perimeter of an inductive trace. In one configuration, the integrated circuit has means for storing electrical energy in a magnetic field. In one configuration, the electrical energy storing means may be the inductive trace 450, as shown in FIG. 4. In another aspect, the aforementioned means may be any structure or any material configured to perform the functions recited by the aforementioned means.

Figure 7:
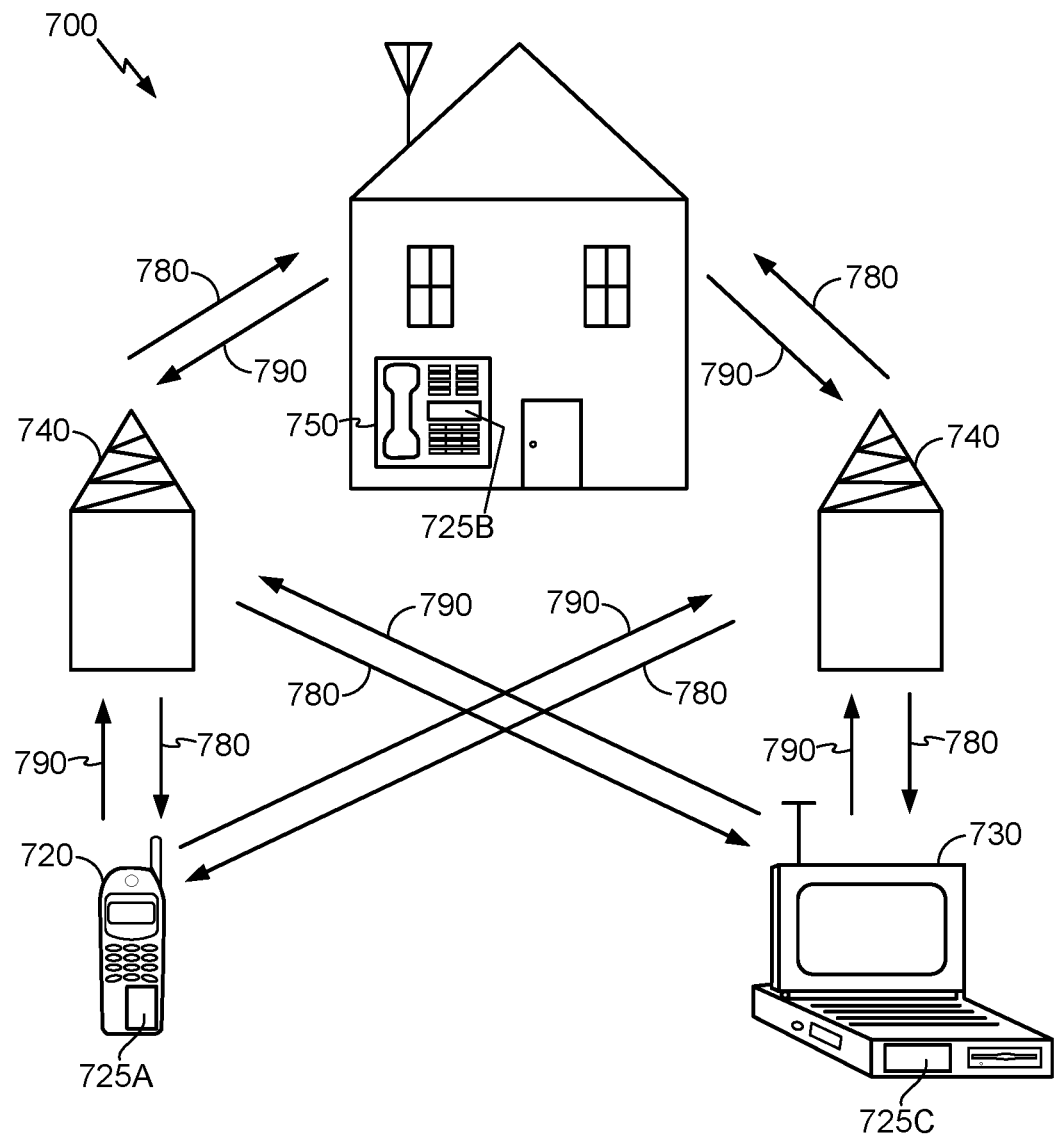
FIG. 7 is a block diagram showing an exemplary wireless communication system in which a configuration of the present disclosure may be advantageously employed.

FIG. 7 is a block diagram showing an exemplary wireless communication system 700 in which an aspect of the present disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed on-chip inductor/transformer that overlaps the capacitor having multiple capacitor fingers and the pair of manifolds. It will be recognized that other devices may also include the disclosed on-chip inductor/transformer that overlaps the capacitor having multiple capacitor fingers and the pair of manifolds, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as a meter reading equipment, or other device that stores or retrieves data or computer instructions, or combinations thereof Although FIG. 7 illustrates remote units, according to the aspects of the present disclosure, the present disclosure is not limited to these exemplary illustrated units. Aspects of the present disclosure may be suitably employed in many devices, which include the disclosed on-chip inductor/transformer that overlaps the capacitor having multiple capacitor fingers and the pair of manifolds.

Figure 8:
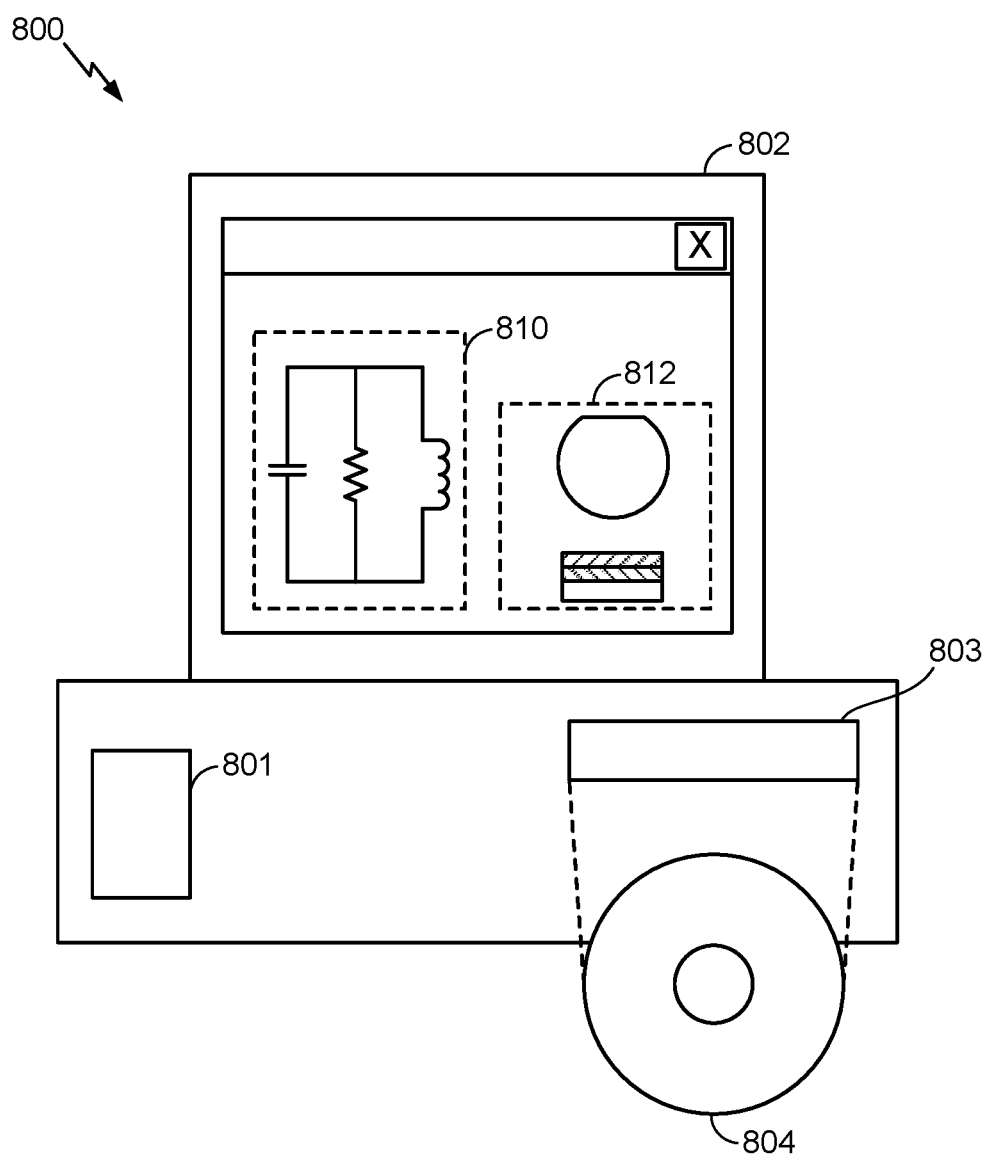
FIG. 8 is a block diagram illustrating a design workstation used for circuit, layout, and logic design of a semiconductor component, according to one configuration.

FIG. 8 is a block diagram illustrating a design workstation used for circuit, layout, and logic design of a semiconductor component, such as the capacitors disclosed above. A design workstation 800 includes a hard disk 801 containing operating system software, support files, and design software such as Cadence or OrCAD. The design workstation 800 also includes a display 802 to facilitate design of a circuit 810 or an RF component 812 such as an on-chip inductor/transformer that overlaps the capacitor having multiple capacitor fingers and the pair of manifolds. A storage medium 804 is provided for tangibly storing the design of the circuit 810 or the RF component 812 (e.g., the on-chip inductor/transformer that overlaps the capacitor having multiple capacitor fingers and the pair of manifolds). The design of the circuit 810 or the RF component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the RF component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized, according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. An integrated circuit, comprising:
   a capacitor in at least one back-end-of-line (BEOL) interconnect level, the capacitor having a plurality of folded capacitor fingers having multiple sides and forming an open loop, and a pair of adjacent, parallel manifolds on a same side of the multiple sides of the folded capacitor fingers, each of the pair of manifolds coupled to at least one of the plurality of folded capacitor fingers; and
   an inductive trace having at least one turn in at least one different BEOL interconnect level, the inductive trace overlapping the pair of manifolds of the capacitor from a top view.

2. The integrated circuit of claim 1, in which a first manifold of a first polarity at a first interconnect level is coupled to at least one folded capacitor finger of the first polarity at the first interconnect level on a first side facing a first direction but not on a second side facing an opposite direction, and a second manifold of a second, different polarity at the first interconnect level is coupled to at least one folded capacitor finger of the second polarity at the first interconnect level on a third side facing the first direction, but not on a fourth side facing the opposite direction.

3. The integrated circuit of claim 1, in which at least one folded capacitor finger on a first interconnect level is coupled to at least one folded capacitor finger on a second interconnect level by at least one via.

4. The integrated circuit of claim 1, in which the pair of manifolds are on a different layer than the inductive trace.

5. The integrated circuit of claim 1, in which at least one of the pair of manifolds extends through multiple interconnect levels and in which at least one manifold portion in one interconnect level is coupled to another manifold portion in another interconnect level by at least one via.

6. The integrated circuit of claim 1, in which at least a portion of the plurality of folded capacitor fingers are within a perimeter defined by the inductive trace.

7. A method of fabricating an integrated circuit, comprising:
   fabricating a capacitor in at least one back-end-of-line (BEOL) interconnect level, the capacitor having a plurality of folded capacitor fingers having multiple sides and forming an open loop, and a pair of parallel, adjacent manifolds on a same side of the multiple sides of the folded capacitor fingers, each of the pair of manifolds coupled to at least one of the plurality of folded capacitor fingers; and
   fabricating an inductive trace having at least one turn in at least one different BEOL interconnect level, the inductive trace overlapping the pair of manifolds of the capacitor from a top view.

8. The method of claim 7, further comprising:
   coupling a first manifold, of the pair of manifolds, having a first polarity to at least one folded capacitor finger of the first polarity at a same interconnect level, on a first side facing a first direction but not on a second side facing an opposite direction; and
   coupling a second manifold, of the pair of manifolds, having a second, different polarity to at least one folded capacitor finger of the second polarity at the same interconnect level on a third side facing the first direction but not on a fourth side facing the opposite direction.

9. The method of claim 7, further comprising coupling at least one folded capacitor finger on a first interconnect level to at least one folded capacitor finger on a second interconnect level by at least one via.

10. The method of claim 7, in which fabricating the capacitor having the pair of manifolds comprises fabricating at least a first portion of the pair of manifolds on a first interconnect level and a second portion of the pair of manifolds on a second interconnect level and coupling the first portion and the second portion with at least one via.

11. An integrated circuit, comprising:
    a capacitor in at least one back-end-of-line (BEOL) interconnect level, the capacitor having a plurality of folded capacitor fingers having multiple sides and forming an open loop, and a pair of parallel, adjacent manifolds on a same side of the multiple sides of the folded capacitor fingers, each of the pair of manifolds coupled to at least one of the plurality of folded capacitor fingers; and
    means for storing electrical energy in a magnetic field within at least one different BEOL interconnect level, the electrical energy storing means overlapping the pair of manifolds of the capacitor from a top view.

12. The integrated circuit of claim 11, in which a first manifold of a first polarity at a first interconnect level is coupled to at least one folded capacitor finger of the first polarity at the first interconnect level on a first side facing a first direction but not on a second side facing an opposite direction, and a second manifold of a second, different polarity at the first interconnect level is coupled to at least one folded capacitor finger of the second polarity at the first interconnect level on a third side facing the first direction, but not on a fourth side facing the opposite direction.

13. The integrated circuit of claim 11, in which at least one folded capacitor finger on a first interconnect level is coupled to at least one folded capacitor finger on a second interconnect level by at least one via.

14. The integrated circuit of claim 11, in which the pair of manifolds are on a different layer than the electrical energy storing means.

15. The integrated circuit of claim 11, in which at least one of the pair of manifolds extends through multiple interconnect levels, and in which at least one manifold portion in one interconnect level is coupled to another manifold portion in another interconnect level by at least one via.

16. The integrated circuit of claim 11, in which at least a portion of the plurality of folded capacitor fingers are within a perimeter defined by the electrical energy storing means.

* * * * *